US012748234B2

(12) United States Patent
Peng

(10) Patent No.: US 12,748,234 B2
(45) Date of Patent: Sep. 29, 2026

(54) SENSOR DEVICE HAVING FIRST INDUCTION COIL SET AND SECOND INDUCTION COIL SET FOR DETERMINING POSITION CHANGE OF METAL ITEM

(71) Applicant: Getac Technology Corporation, New Taipei City (TW)

(72) Inventor: Cheng-Shih Peng, Taipei City (TW)

(73) Assignee: Getac Technology Corporation, New Taipei City (TW)

( * ) Notice: Subject to any disclaimer, the term of this patent is extended or adjusted under 35 U.S.C. 154(b) by 143 days.

(21) Appl. No.: 18/426,447

(22) Filed: Jan. 30, 2024

(65) Prior Publication Data

US 2025/0028068 A1 Jan. 23, 2025

Related U.S. Application Data

(60) Provisional application No. 63/527,527, filed on Jul. 18, 2023.

(30) Foreign Application Priority Data

Sep. 14, 2023 (TW) ................................ 112134976

(51) Int. Cl.
*G01V 3/10* (2006.01)
*F41C 33/02* (2006.01)
(Continued)

(52) U.S. Cl.
CPC ............ *G01V 3/105* (2013.01); *F41C 33/029* (2013.01); *G01R 33/0005* (2013.01); *G01R 33/0023* (2013.01); *H04N 23/651* (2023.01)

(58) Field of Classification Search
None
See application file for complete search history.

(56) References Cited

U.S. PATENT DOCUMENTS 7,292,026 B2 * 11/2007 Lee ........................ F02D 11/106
324/207.17
7,463,020 B2 12/2008 Kuhn
(Continued)

FOREIGN PATENT DOCUMENTS

CN 102687399 A 9/2012
CN 104521142 A 4/2015
(Continued)

OTHER PUBLICATIONS

Search Report issued on Nov. 5, 2024 for EP application No. 24154954.2, 13 pages.
(Continued)

*Primary Examiner* — Richard Isla
(74) *Attorney, Agent, or Firm* — Cooper Legal Group, LLC

(57) ABSTRACT

A sensor device is configured to be disposed on a surface of a side of an object. The sensor device includes a casing, and the casing has a first side that is distant from the object and a second side that is relatively closer to the object. A first induction coil set is disposed on the first side, and a second induction coil set is disposed on the second side. The sensor device further includes a control circuit board. The control circuit board includes a connection line that is electrically connected with the first induction coil set and the second induction coil set, and a microcontroller. When the sensor device is in operation, the microcontroller determines a position change of a metal item on another side of the object according to a physical quantity difference between the first induction coil set and the second induction coil set.

17 Claims, 10 Drawing Sheets

(51) Int. Cl.

| | |
|---|---|
| ***G01R 33/00*** | (2006.01) |
| *H04N 23/65* | (2023.01) |

(56) References Cited

U.S. PATENT DOCUMENTS

| | | | | |
|---|---|---|---|---|
| 9,007,071 | B2 * | 4/2015 | Gong | H03K 17/9525 324/656 |
| 9,518,948 | B2 * | 12/2016 | Miyamoto | G01R 33/123 |
| 10,190,846 | B2 * | 1/2019 | Wagner | G01D 5/145 |
| 10,338,260 | B2 * | 7/2019 | Takahashi | G01V 3/104 |
| 10,516,394 | B2 * | 12/2019 | Kántor | H01F 27/36 |
| 10,788,548 | B2 * | 9/2020 | Findeklee | G01R 33/4608 |
| 11,462,201 | B2 * | 10/2022 | Tisch | H04R 1/08 |
| 11,639,841 | B2 | 5/2023 | Wagner et al. | |
| 2014/0368220 | A1 | 12/2014 | Kum et al. | |
| 2017/0302273 | A1 | 10/2017 | Kantor et al. | |
| 2019/0063864 | A1 * | 2/2019 | Stewart | F41A 17/20 |
| 2025/0029481 | A1 * | 1/2025 | Wu | G08C 19/06 |

FOREIGN PATENT DOCUMENTS

| | | | |
|---|---|---|---|
| CN | 106716836 | A | 5/2017 |
| CN | 208671806 | U | 3/2019 |
| CN | 109690232 | A | 4/2019 |
| CN | 210180378 | U | 3/2020 |
| CN | 217693289 | U | 10/2022 |
| CN | 115695695 | A | 2/2023 |
| CN | 115955232 | A | 4/2023 |
| DE | 3228524 | A1 | 2/1984 |
| DE | 102006040550 | A1 | 3/2007 |
| EP | 2493076 | A1 | 8/2012 |

OTHER PUBLICATIONS

Search Report issued on Jul. 3, 2024 for EP application No. 24154954.2, 15 pages.

* cited by examiner

SENSOR DEVICE HAVING FIRST INDUCTION COIL SET AND SECOND INDUCTION COIL SET FOR DETERMINING POSITION CHANGE OF METAL ITEM

CROSS-REFERENCE TO RELATED PATENT APPLICATION

This application claims the benefit of priorities to the U.S. Provisional Patent Application Ser. No. 63/527,527, filed on Jul. 18, 2023, and Taiwan Patent Application No. 112134976, filed on Sep. 14, 2023. The entire content of each of U.S. Provisional Patent Application Ser. No. 63/527,527 and Taiwan Patent Application No. 112134976 is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensor device, and more particularly to a sensor device with a structure of two induction coil sets.

BACKGROUND OF THE DISCLOSURE

Currently, a security guard, a soldier, or a police officer who needs to carry a gun or any other weapon often wears a body-worn recording device. The body-worn recording device can completely record images/videos of the person when using the gun or any other weapon. The recorded images can be referred to for resolving disputes associated with use of the weapon. In addition, the recorded images can be transmitted to a control center that supports duties of the security guard, the soldier, or the police officer for further applications, such as quickly providing assistance in an emergency.

Conventionally, the person who wears the body-worn recording device needs to manipulate the recording device by himself to record images. Since the body-worn recording device is generally equipped with a small capacity battery due to its small-sized body, the need for long-term recording cannot be met. As such, the recording function of the body-worn recording device is activated only when recording is required. However, the person may forget to activate the recording function in an emergency, or the recording device may fail to record critical images in time.

Accordingly, the above problems may limit the function of the conventional body-worn recording device. Therefore, a sensor device that is capable of detecting specific emergency events is required, so as to timely activate the body-worn recording device and timely record critical images.

SUMMARY OF THE DISCLOSURE

In response to the above-referenced technical inadequacies, the present disclosure provides a sensor device that is used to detect a specific event. The sensor device is adapted to be disposed on a surface of a side of an object. The sensor device includes a casing, and the casing has a first side that is distant from the object and a second side is relatively closer than the first side to the object. A first induction coil set and a second induction coil set are disposed inside the casing, the first induction coil set is disposed on the first side, and the second induction coil set is disposed on the second side. The sensor device includes a control circuit board, and the control circuit board includes a connection line electrically connected with the first induction coil set and the second induction coil set and a microcontroller.

When the sensor device is in operation, the microcontroller determines a position change of a metal item disposed on another side of the object according to a physical quantity difference formed between the first induction coil set and the second induction coil set.

In one of the possible or preferred embodiments, the first induction coil set and the second induction coil set are both disposed on an inner surface of the casing.

In one of the possible or preferred embodiments, the second side represents an outer surface of the casing, and the second induction coil set is disposed on the outer surface.

Further, the second side of the casing includes a containing slot, and the second induction coil set is disposed in the containing slot.

In one of the possible or preferred embodiments, an opening is formed on a wall structure of the casing that has the second induction coil set disposed thereon, such that the second induction coil set and the first induction coil set are not obstructed by the wall structure.

Further, the casing is configured to have a positioning hole that acts as an airtight evacuation hole for a cavity formed by the casing. The airtight evacuation hole is sealed by a waterproof breathable membrane. The second induction coil set has an opening corresponding to the positioning hole.

Further, the control circuit board of the sensor device also includes a communication unit, and the communication unit is used to transmit an activation signal that is generated by the microcontroller according to the physical quantity difference.

Further, the control circuit board also includes a power unit that is controlled by the microcontroller, and the power unit provides current signals to the first induction coil set and the second induction coil set for generating an induced magnetic field.

Structurally, the first induction coil set includes two coils mounted on two sides of a first substrate, and the second induction coil set includes two coils mounted on two sides of a second substrate. An inductive area of the first induction coil set is configured to be smaller than an inductive area of the second induction coil set.

In one embodiment of the sensor device, the object on which the sensor device is disposed is a holster. The holster is used for accommodating a gun. The gun includes the metal item that is capable of being sensed by the sensor device. The sensor device corresponds in position to the metal item when the gun is put inside the holster.

The sensor device implements a proximity sensor or a differential inductive switch. The first induction coil set and the second induction coil set respectively form two different effective sensing ranges, so as to form a reference inductance and an inductive inductance. An inductance difference between the reference inductance and the inductive inductance is changed when the position of the metal item changes.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
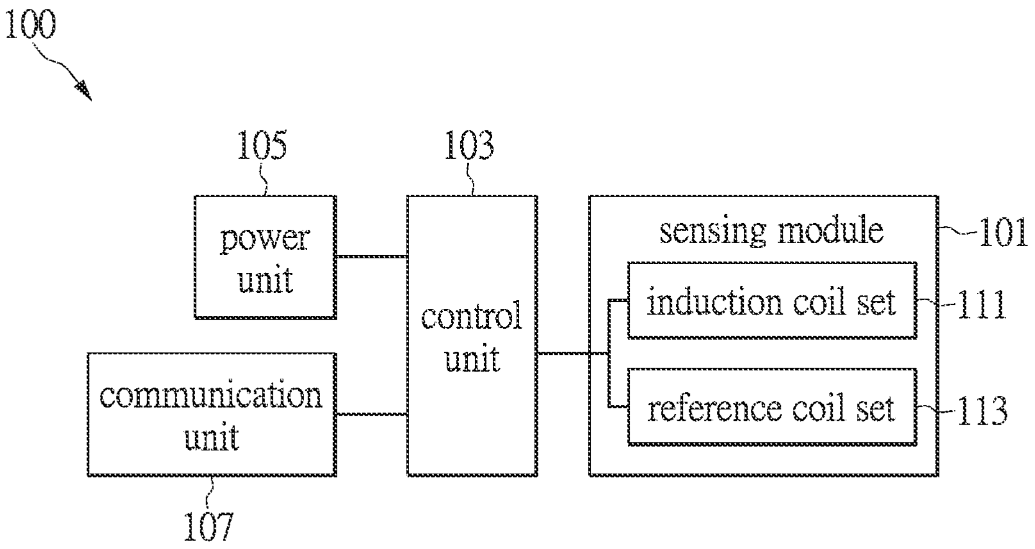
FIG. 1 is a schematic diagram illustrating circuit components of a sensor device according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

The present disclosure provides a sensor device that can be attached to a specific object. The sensor device is equipped with an independent power supply and operating capability. The sensor device can also be individually disposed on the object, and applies an induction principle to detect movement of a corresponding item. The present disclosure also relates to a gun sensing system and a recording system that incorporate the sensor device.

FIG. 1 is a schematic diagram illustrating circuit components of the sensor device according to one embodiment of the present disclosure.

Figure 3:
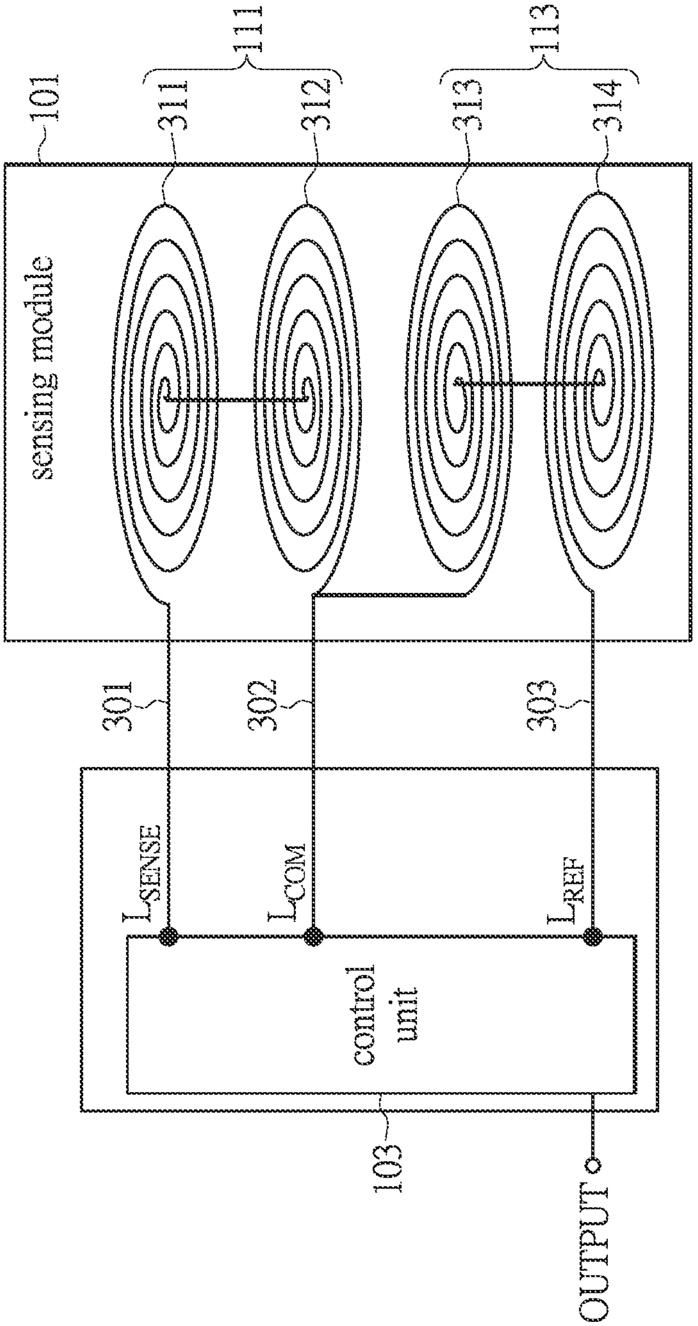
FIG. 3 is a schematic diagram illustrating induction coil sets of the sensor device according to one embodiment of the present disclosure.

The circuit components of a sensor device 100 include a control unit 103 and other circuit components electrically connected with the control unit 103. One of the circuit components is a sensing module 101. The main structural features of the sensing module 101 are two coil sets that are arranged in a laminated structure. In FIG. 1, the sensing module 101 includes a reference coil set 113 and an induction coil set 111, and the configuration of the sensing module 101 is shown in the embodiment of FIG. 3.

In one method of operating the sensor device 100, the sensor device 100 can be fixed on a surface of a side of the object via various fixing methods. While the induction coil set 111 of the sensing module 101 is configured to be in close proximity to the object, the reference coil set 113 is relatively distant from the object for providing a reference level. An item to be sensed by the sensor device 100 is preferably a metal sheet. When the position of the item changes, a physical quantity difference is formed between an inductance generated by the induction coil set 111 and the reference level provided by the reference coil set 113. Therefore, the control unit 103 can rely on this physical quantity difference to determine a position change of the item that is at the other side of the object.

According to one embodiment of the present disclosure, the circuit components of the sensor device 100 shown in FIG. 1 also include a communication unit 107. The communication unit 107 is electrically connected with the control unit 103. When the control unit 103 generates an activation signal according to the physical quantity difference, the communication unit 107 transmits the activation signal by a specific transmission protocol, such as Bluetooth™ communication protocol. For example, a Bluetooth™ Low Energy (BLE) technology is implemented for broadcasting the activation signal. Other technologies that are able to transmit the activation signal are, for example, a WiFi™ communication technology and a near-field communication (NFC) technology. It should be noted that the implementation of the communication unit is not limited in the present disclosure.

Further, the sensor device 100 includes a power unit 105 that is electrically connected with the control unit 103 and controlled by the control unit 103. The power unit 105 supplies a current signal to the sensing module 101, and allows both the induction coil set 111 and the reference coil set 113 to respectively generate induced magnetic fields for covering the item to be sensed.

Figure 2:
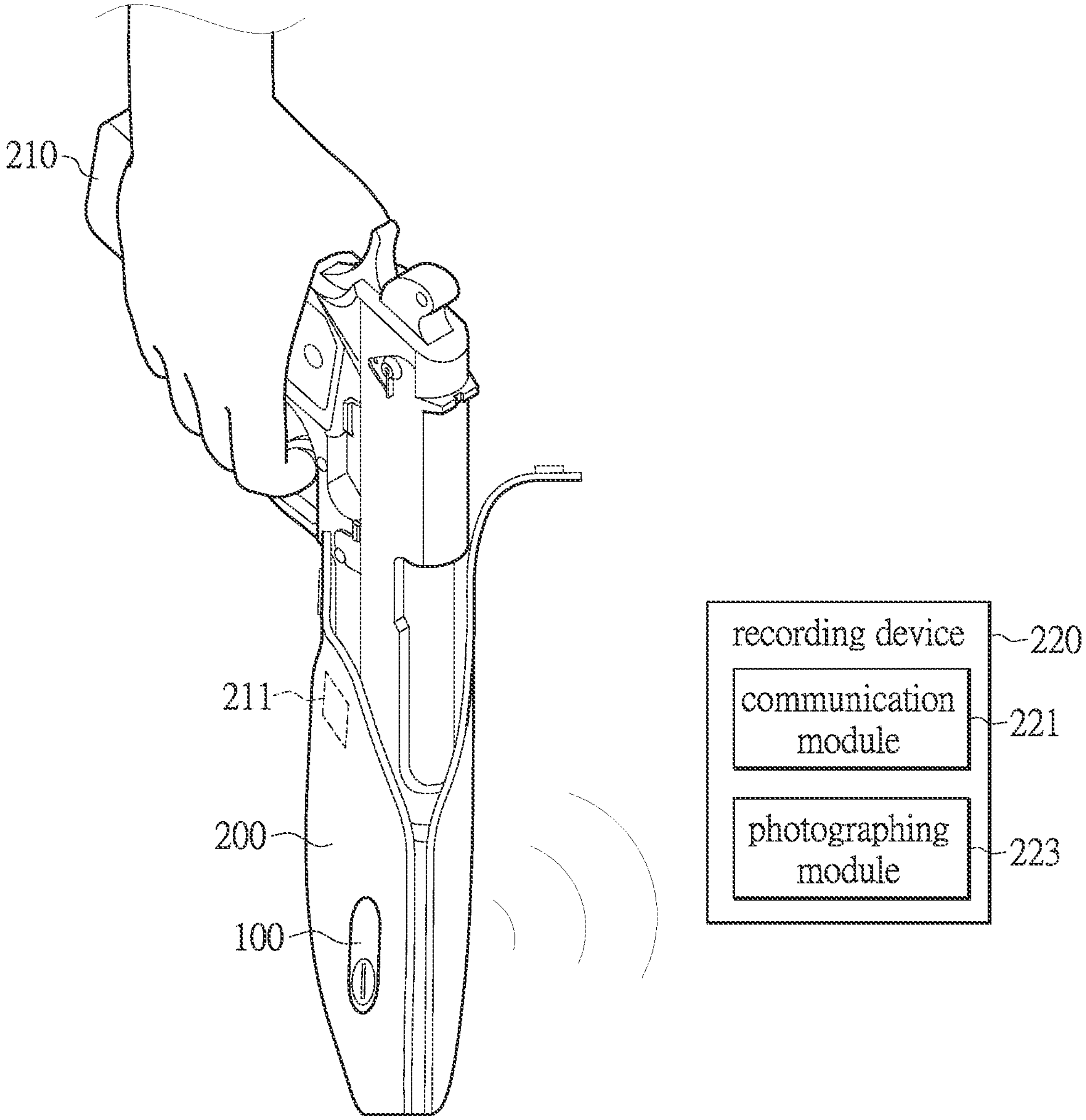
FIG. 2 is a schematic diagram illustrating a gun sensing system implemented by the sensor device according to one embodiment of the present disclosure.

Reference is made to FIG. 2, which is a schematic diagram illustrating a gun sensing system that incorporates a standalone sensor device having an independent power supply and capable of communication and signal processing according to one embodiment of the present disclosure. A recording system that can cooperatively operate with the sensor device is also shown in FIG. 2.

The gun sensing system shown in FIG. 2 essentially includes a holster 200 and the sensor device 100 disposed on an outer surface of the holster 200. The holster 200 is used to accommodate a gun 210. The sensor device 100 is used to sense movement of the gun 210. In one implementation, a magnetically-sensitive item (e.g., a metal item 211) that can be sensed by the sensor device 100 is configured to be disposed on the gun 210. The position of the sensor device 100 disposed on the holster 200 corresponds in position to the metal item 211 when the gun 210 is put inside the holster 200. That is, when the gun 210 is put inside the holster 200, the metal item 211 should be disposed at a position that allows the metal item 211 to be sensed by the sensor device 100.

References are made to FIG. 1 and FIG. 2. When the gun sensing system is in operation, the power unit 105 of the sensor device 100 is used to supply the current signal to the sensing module 101 of the sensor device 100, so as to enable the induction coil set 111 and the reference coil set 113 to generate induced magnetic fields. The range of the induced magnetic fields should cover the entire metal item 211. According to one of the embodiments of the present disclosure, the induction coil set 111 of the sensor device 100 is in close proximity to the holster 200, and the reference coil set 113 is relatively distant from the holster 200.

When the gun 210 attached with the metal item 211 moves (e.g., the gun 210 is pulled out of the holster 200), the metal item 211 moves with the gun 210. At this time, the physical quantity difference is formed between the inductance generated by the induction coil set 111 and the reference level provided by the reference coil set 113. This physical quantity difference represents a change of inductance between the induction coil set 111 and the reference coil set 113. The control unit 103 of the sensor device 100 can determine a position change of the metal item 211 according to an electrical signal formed from the change of inductance. Therefore, the gun sensing system relies on the physical quantity difference to detect if the gun 210 is pulled out of the holster 200 or put inside the holster 200.

According to one embodiment of the present disclosure, when the change of inductance between the induction coil set 111 and the reference coil set 113 of the sensor device 100 meets a threshold set by the system, the control unit 103 of the sensor device 100 generates the activation signal, and the activation signal is broadcasted to devices near the sensor device 100. For example, the activation signal can be received by a recording device 220 of FIG. 2 via a communication module 221, and a photographing module 223 can be activated by the activation signal to start photographing. Accordingly, the recording device 220 can be immediately activated when the gun 210 is determined to be pulled out of the holster 200.

FIG. 3 is a schematic diagram illustrating main circuit components and induction coil sets of the sensor device according to one embodiment of the present disclosure.

The main components of the sensor device in FIG. 3 include the control unit 103 and the sensing module 101. The control unit 103 is capable of signal processing. The control unit 103 is electrically connected with the induction coils of the sensing module 101 via connection lines 301, 302, 303. The control unit 103 can therefore receive a sensing value $L_{SENSE}$ and a reference level $L_{REF}$ generated by the sensing module 101, and provide a common ground signal $L_{COM}$.

The sensing module 101 includes the reference coil set 113 and the induction coil set 111 that are arranged to have a stacked structure. The reference coil set 113 includes a first reference coil 313 and a second reference coil 314 that are disposed on two sides of a substrate. The first reference coil 313 and the second reference coil 314 are electrically interconnected via middle contacts of the two coils. The reference coil set 113 provides the reference level $L_{REF}$. The induction coil set 111 includes a first induction coil 311 and a second induction coil 312 that are disposed on two sides of another substrate. Similarly, the first induction coil 311 and the second induction coil 312 are electrically interconnected via middle contacts of the two coils. The induction coil set 111 generates the sensing value $L_{SENSE}$. One coil of the reference coil set 113 and one coil of the induction coil set 111 can jointly form a common ground signal. As shown in the diagram, an output end of the second induction coil 312 and an output end of the first reference coil 313 jointly form the common ground signal $L_{COM}$.

In the sensor device, the sensing module 101 embodies a proximity sensor or a differential inductive switch. When a power unit (not shown in the diagram) of the sensor device is driven to supply a current to the two coil sets (311, 312, 313, 314) of the sensing module 101, the reference coil set 113 and the induction coil set 111 respectively form different effective sensing ranges, so as to form a reference inductance and an inductive inductance.

According to an operational principle of the differential inductive switch, when the current is supplied to the two coil sets of the sensor device, an electromagnetic field will be formed around each of the coil sets and allows the two coil sets to form different effective sensing ranges. If any external metal object (e.g., the metal item attached to the gun) approaches the sensing range of an inductive proximity switch, the electromagnetic field formed around each of the coil sets of the inductive proximity switch is disrupted, thereby changing the impedance over the coil sets. Accordingly, a reference voltage is formed in the reference coil set, and an inductive voltage is also formed in the induction coil set. Therefore, the control circuit can calculate a differential signal generated between the two coil sets, and the control circuit can determine a position change of the metal item.

When the sensor device is in operation, the control unit can enable the sensing module by a pulse-width modulation technology. For example, the control unit can enable the proximity sensor or the differential inductive switch to detect an inductance difference between the inductive values generated by the reference coil set and the induction coil set. The sensing module then outputs a high voltage or a low voltage based on a positive or a negative inductance difference.

In one embodiment of the present disclosure, when the subject to be sensed by the sensor device moves (e.g., the gun 210 is pulled out of the holster 200, or the gun 210 is put inside to the holster 200 according to the above embodiment), the metal item 211 disposed on the gun 210 moves together, such that the sensing module 101 is able to sense an inductance change between the induction coil set 111 and the reference coil set 113. That is to say, when the metal item 211 approaches or moves away from one side of the induction coil set 111, the inductance change occurs between the induction coil set 111 and the reference coil set 113. Further, since the induction coil set 111 is closer to the metal item 211, the inductance generated by the induction coil set 111 is relatively lower or higher than the inductance generated by the reference coil set 113. The sensing module 101 then receives the physical quantity difference and outputs a sensing result.

The physical quantity difference represents the inductance change between the induction coil set and the reference coil set. The control unit 103 receives the sensing value $L_{SENSE}$, the common ground signal $L_{COM}$, and an inductance change between the reference level $L_{REF}$ and the common ground signal $L_{COM}$. The control unit 103 can rely on an electrical signal converted from the inductance change to determine a position change of the metal item. The position change of the metal item can be moving away from or approaching the sensor device.

Figure 4:
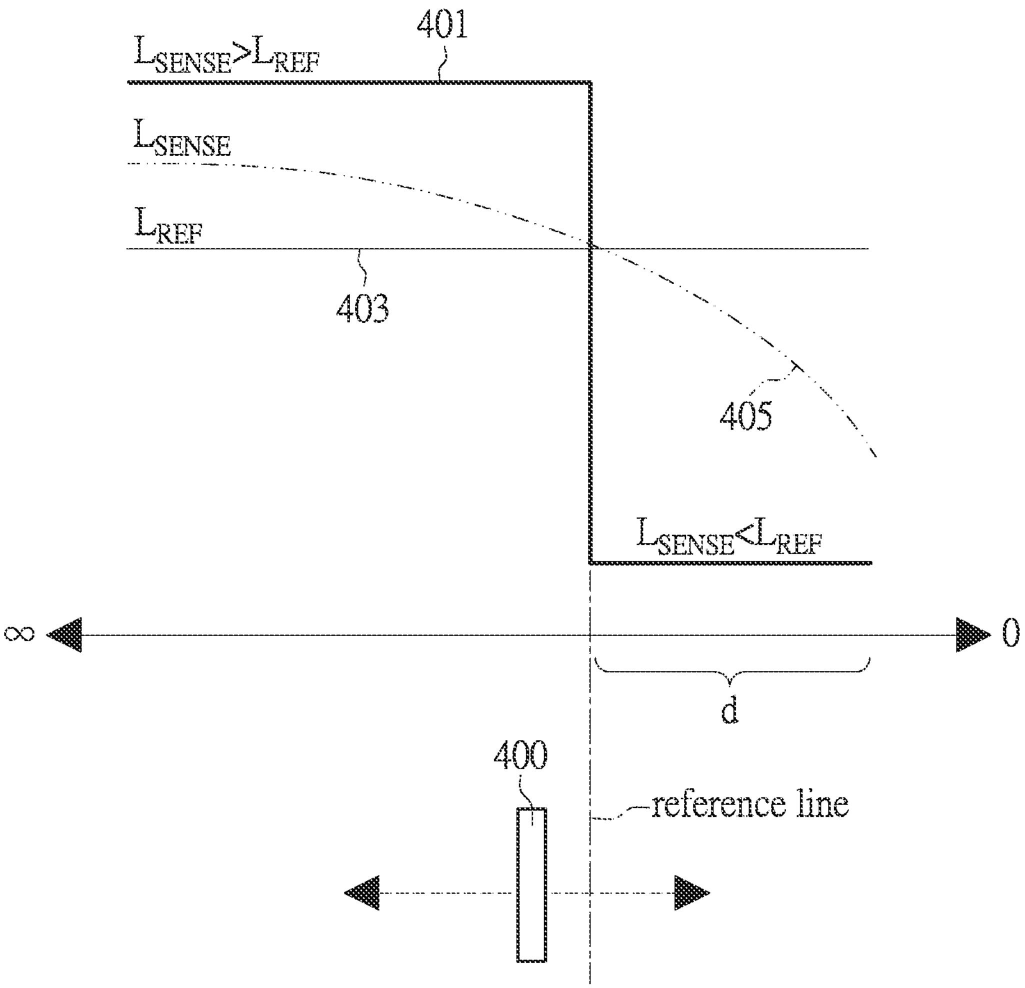
FIG. 4 is a schematic diagram illustrating a technical principle of detecting a position change of an item under test by induction coils according to one embodiment of the present disclosure.

Reference is made to FIG. 4, which is a schematic diagram illustrating a technical principle of detecting the position change of an item under test by the induction coils.

FIG. 4 shows inductance changes of the sensing value $L_{SENSE}$, the reference level $L_{REF}$, and the common ground signal $L_{COM}$ that occur due to movement of an item under test 400 (e.g., the metal item 211). Taking the gun sensing system as an example (referring to FIG. 2), since the item under test 400 is disposed on the gun 210, the item under test 400 is spaced apart from the sensor device 100 that is disposed on the holster 200 by an initial distance d. The reference coil set provides a constant reference level $L_{REF}$, as shown by a reference signal curve ($L_{REF}$) 403 in FIG. 4. The inductance generated by the induction coil set changes with the movement of the item under test 400, as shown by a sensing signal curve ($L_{SENSE}$) 405 in FIG. 4. When there is a relative movement between the item under test 400 and the inductance coil set of the sensor device, which includes moving away (i.e., toward "∞" direction) or approaching (i.e., toward "0" direction), the electromagnetic field provided by the induction coil set is subjected to change. According to the electromagnetic induction principle, when an induction current is formed inside the coils, the coils will induce an inductance effect to generate a voltage for suppressing change of the current. Therefore, the inductance coils can resist an increasing current when the induction current increases. Conversely, the inductance coils can resist a decreasing current when the induction current decreases. The sensing signal curve ($L_{SENSE}$) 405 is formed accordingly.

The physical quantity difference represents the inductance change between the induction coil set and the reference coil set. Referring to FIG. 4, when the item under test 400 (e.g., the metal item 211) moves, an output signal curve 401 (such as a switching signal) is formed. Further, when the item under test 400 (e.g., the metal item 211) moves away from the induction coils, an equivalent inductance generated by the induction coil set will be higher than an equivalent inductance value of the reference coil set, and the sensing result is shown as a left half of the output signal curve 401 in FIG. 4. The sensing result shows that the sensing value $L_{SENSE}$ is larger than the reference level $L_{REF}$. Conversely, when the item under test 400 (e.g., the metal item 211) approaches the induction coils, the equivalent inductance of the induction coil set will be lower than the equivalent inductance value of the reference coil set, and the sensing result is shown as a right half of the output signal curve 401 in FIG. 4. The sensing result shows that the sensing value $L_{SENSE}$ is smaller than the reference level $L_{REF}$.

Therefore, the control unit 103 of the sensor device of FIG. 3 can obtain the inductance change calculated by the sensing module 101 according to the inductance values generated by the induction coil set 111 and the reference coil set 113. The control unit 103 can then rely on the inductance change to determine the position change of the metal item. An output signal OUTPUT is generated by a specific pin of the control unit 103.

In the gun sensing system, when the metal item disposed on the gun approaches or moves away from one side of the induction coil set, the control unit receives from the sensing module a sensing result that represents an inductance change between the induction coil set and the reference coil set since the inductance of the induction coil set is lower or higher than the inductance (e.g., a reference level) of the reference coil set. The sensing result obtained from the sensing module is the inductance change between the induction coil set and the reference coil set. The control unit can rely on the output signal curve 401 shown in FIG. 4 to determine a time at which the gun is pulled out of the holster or put inside the holster, and accordingly activate a photographing module to start or stop recording.

Figure 5:
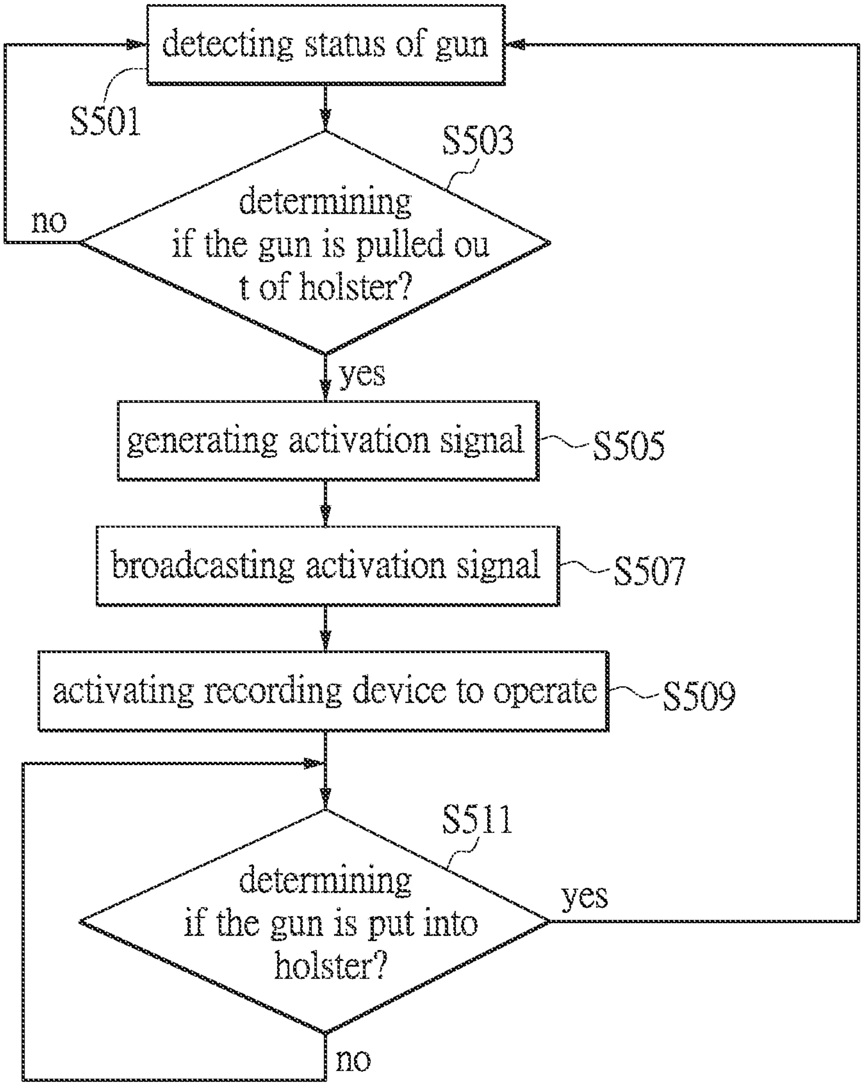
FIG. 5 is a flowchart illustrating a process of sensing a position change of a gun by the sensor device according to one embodiment of the present disclosure.

FIG. 5 is a flowchart illustrating a process of sensing the position change of the gun by the sensor device according to one embodiment of the present disclosure.

The sensor device is disposed on the holster. The metal item is attached to the gun. The sensor device corresponds in position to the metal item. After being activated, the sensor device starts to detect the status of the gun (step S501). When the control unit obtains the sensing result from the sensing module, the control unit can determine whether or not the gun is pulled out of the holster (step S503). If the gun is detected to be not pulled out of the holster, the process returns to step S501. If the gun is detected to be pulled out of the holster, the control unit generates the activation signal (step S505), and broadcasts the activation signal via the communication unit (step S507). The activation signal can record the event of the gun being pulled out of the holster and a timestamp of the event. Upon receiving the activation signal, a recording device is activated to start recording (step S509).

When the recording device is recording, the sensor device continues to operate. The control unit determines the position change of the gun (the metal item) according to an electrical signal generated by the sensing module. The process proceeds with detecting whether or not the gun is put inside the holster (step S511). If the gun is detected to be not put inside the holster, the step S511 is repeated. If the gun is detected to be put inside the holster, the process returns to the initial step S501. In one embodiment of the present disclosure, when the gun is detected to be put inside the holster according to the sensing result, the control unit can issue a termination signal and broadcast the termination signal. Upon receiving the termination signal, the recording device stops recording.

It should be noted that the sensor device provides a power-saving mode. For example, in step S503, when the control unit determines that the gun is pulled out of the holster according to the sensing result, the control unit of the sensor device generates the activation signal. In the meantime, the control device starts a timer for determining whether or not a duration for pulling the gun out of the holster exceeds a time threshold. If the duration for pulling the gun out of the holster exceeds the time threshold, the sensor device enters the power-saving mode.

Figure 6:
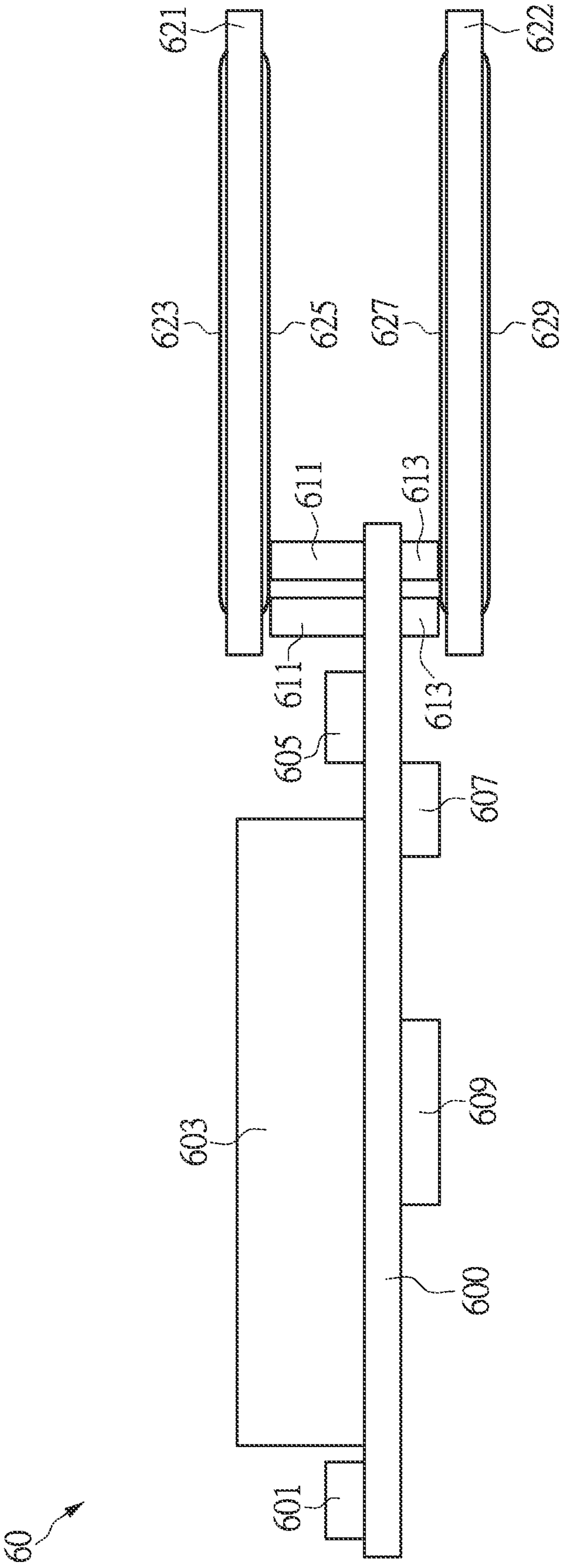
FIG. 6 is a schematic diagram illustrating circuits of the sensor device according to one embodiment of the present disclosure.

Reference is made to FIG. 6, which is an exemplary example of the circuit components of the sensor device.

FIG. 6 shows a sensor device 60 that includes a main board 600. The main board 600 serves as a control circuit board of the sensor device 60. Various circuit components are disposed on the main board 600. FIG. 6 shows that the sensor device 60 includes an indication light (e.g., LED) 601 for indicating an operating status of the sensor device 60 and a power unit (e.g., a battery) 603 for supplying power to the sensor device 60. The main board 600 of the sensor device 60 also includes a power button 605, a control unit 607, and a communication unit 609.

A user can push the power button 605 to activate or deactivate the sensor device 60. The communication unit 609 is used to transmit signals generated by the control unit 607. The control unit 607 can be a microcontroller used in the sensor device 60 for controlling operation of the sensor device 60 and for determining the position of the item under test according to the sensing result generated by the sensing module.

According to one of the embodiments of the present disclosure, the sensor device provides a power-saving mechanism. The control unit 607 can perform a timer PWM control for controlling timing by a pulse width modulation technology. In this way, the sensor device can achieve frequency controlling. Not only is the sensing module of the sensor device 60 enabled to obtain the inductance values generated by the induction coil set and the reference coil set, but the control unit 607 is also allowed to enter the power-saving mode (e.g., MCU (microcontroller unit) sleep mode) under a specific circumstance (e.g., the gun being pulled out of the holster for a long time). For example, when the control unit 607 enters the power-saving mode, the communication function of the control unit 607 is deactivated, or a working frequency of the control unit 607 is reduced.

The main board 600 electrically connects with a first substrate 621 of the reference coil set and a second substrate 622 of the indication coil set via the conductive connectors 611 and 613 respectively. The reference coil set includes the references coils 623 and 625 disposed on two sides of the first substrate 621 and the induction coil set includes the induction coils 627 and 629 disposed on two sides of the second substrate 622.

The coils disposed on the two sides in the sensing module are configured to be the stacked structure so as to form an induced magnetic field. The induced magnetic field can cover the item under test, e.g., the metal item. When the item under test moves, an equivalent inductance generated by the induction coils accordingly changes. Further, for the stacked induction coil set and the reference coil set, the equivalent inductance of the two coil sets changes because the item under test approaches the coil sets. Based on the design of structure, the change of the equivalent inductance of the induction coil set will be larger than the change of the equivalent inductance of the reference coil set.

It should be noted that an inductive range of the induction coil is approximately proportional to a distance between the induction coil and the item under test since an inductive distance is getting shorter when the item under test (e.g., the metal item) approaches the sensing module. Therefore, the size of the reference coil set is designed as small as possible for improving the drawback that the distance to sense the item under test becomes shorter due to the equivalent inductance of the reference coil set will be changed when the item under test approaches the induction coil.

In one of the embodiments of the present disclosure, the induction coil set is configured to be closer to the holster, and the reference coil set is configured to be relatively distant from the holster. Accordingly, if an inductive area of the reference coil set (the reference coils 623, 625) is configured to be smaller than an inductive area of the induction coil set (the induction coils 627, 629), the influence of the reference coil set (the reference coils 623, 625) on the induction coil set (the induction coils 627, 629) and the sensing result can be reduced, thereby effectively reducing an inductance change occurred when the metal item approaches the reference coil set.

The exemplary structure of the sensor device can refer to the schematic diagrams of FIG. 7 to FIG. 10. In one of the embodiments of the present disclosure, the distance between the reference coil set and the induction coil set of the sensor device is larger, and the distance between the detectable item under test and the sensor device can be farther. On the contrary, the distance between the sensor device and the item under test is shorter, and the detection of the item under test can be more sensitive. Therefore, the casing of the sensor device can include the reference coil set and the induction coil set, that is to say, one of the reference coil set and the induction coil set can be moved to exterior of the casing, thereby to increase the distance between the reference coil set and the induction coil set. Furthermore, the exterior induction coil set can be attached to a surface of an object close to the item under test for shortening the distance from the item under test.

Figure 7:
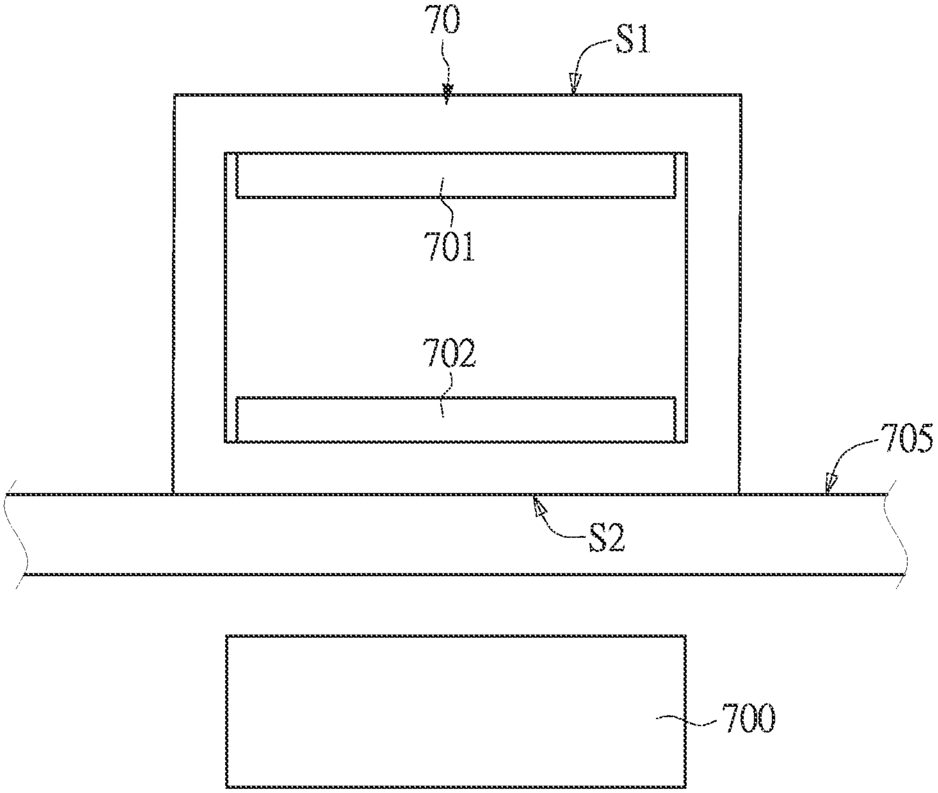
FIG. 7 is a schematic diagram illustrating a structure of the sensor device according to one embodiment of the present disclosure.

Reference is made to FIG. 7, which is a schematic diagram illustrating the structure of the sensor device according to one embodiment of the present disclosure. The sensor device includes a casing 70 that is adapted to be disposed on a surface of a side of an object. The casing 70 of the sensor device of FIG. 7 is attached to an adhesive surface 705. The casing 70 includes a first side S1 that is distant from the adhesive surface 705 and a second side S2 that is relatively closer to the adhesive surface 705.

In the present embodiment, the first induction coil set and the second induction coil set are both disposed on an inner surface of the casing 70. In one of the embodiments, the first induction coil set (e.g., the reference coil set 701) is disposed on the first side S1, and a second induction coil set (e.g., the induction coil set 702) is disposed on the second side S2. Referring to the embodiment shown in FIG. 6, a control circuit board of the sensor device is electrically connected with the connection lines of the first induction coil set and the second induction coil set and the microcontroller (e.g., the control unit) respectively.

When the system is in operation, the sensor device disposed on one side of the adhesive surface 705 is used to detect the item under test 700 being disposed on another side of the adhesive surface 705. The item under test 700 is required to be an object that is detectable by the inductance coil for forming a change of inductance. The microcontroller of the sensor device relies on a physical quantity difference between the first induction coil set and the second induction coil set to determine a position change of the item under test 700.

When a gun sensing system as an example, the adhesive surface 705 is such as an outer surface of a holster and a gun is at another side of the holster. The gun serves as the item under test 700 of FIG. 7. The sensor device is used to detect status of the gun, i.e., whether or not the holster is pulled out of the holster or the gun is accommodated in the holster. In one further embodiment of the present disclosure, a detectable metal item (e.g., the item under test 700 of FIG. 7) is attached to the gun. The sensor device disposed on the outer surface of the holster is used to detect change of the position of the metal item, so that the sensor device can detect whether or not the gun is pulled out of the holster or accommodated into the holster.

Figure 8:
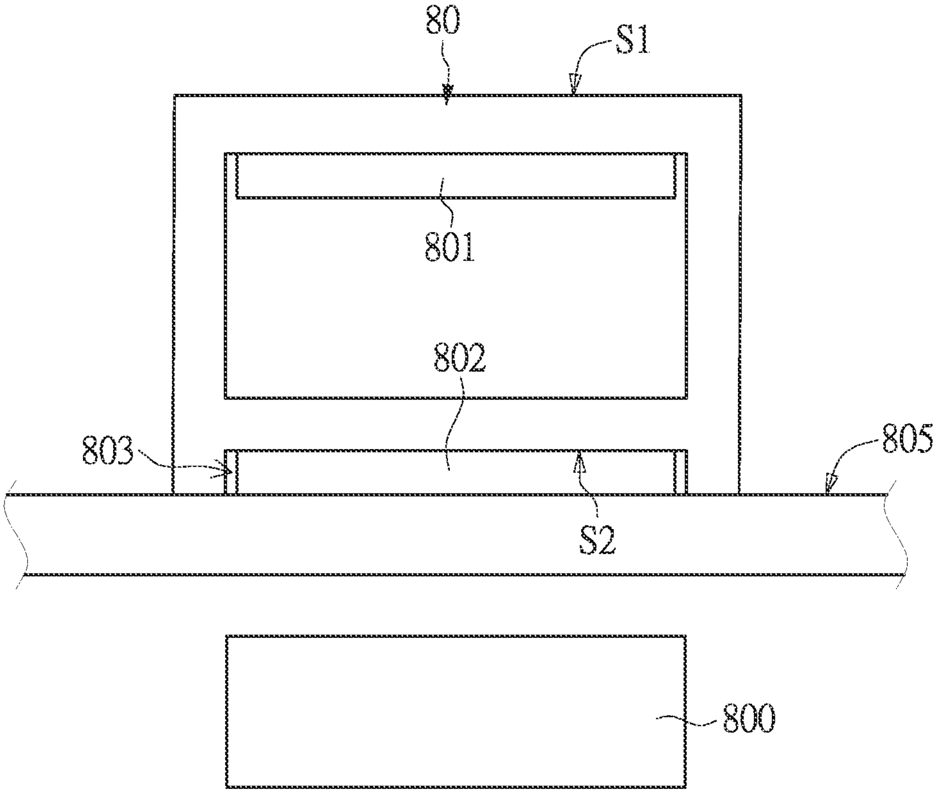
FIG. 8 is a schematic diagram illustrating the structure of the sensor device according to another embodiment of the present disclosure.

FIG. 8 is a schematic diagram illustrating the structure of the sensor device according to another embodiment of the present disclosure. In order to improve a sensing distance and sensitivity, within a limited space of the casing, a distance between the two induction coil sets inside the casing is required to be increased, and a distance between the sensor device and the item under test is required to be shortened. In the present embodiment, a distance between a first induction coil set and a second induction coil set can be increased, so as to increase the sensing distance for sensing the item under test. Further, by shortening a distance between the induction coil set and the item under test, the sensitivity of sensing the item under test can be improved.

FIG. 8 shows a casing 80 of the sensor device according to one embodiment of the present disclosure. Similarly, the first induction coil set (e.g., a reference coil set 801) can be disposed on a first side S1 of the casing 80. Further, a second induction coil set (e.g., an induction coil set 802) can be disposed on a second side S2 of the casing 80. The present embodiment shows that the second side S2 serves as an outer surface of the casing 80. The second induction coil set (e.g., the induction coil set 802) is disposed in a containing slot 803 formed on the outer surface. Structurally, the second induction coil set is attached to an adhesive surface 805. Therefore, the second induction coil set is closer to an item under test 800 that is at the other side of the adhesive surface 805, and a distance between the second induction coil set and the first induction coil set (e.g., the reference coil set 801) can be increased.

It should be noted that, as compared with the embodiment of FIG. 7, the induction coil set 802 is closer to the item under test 800 by being disposed on an outer surface of the casing in the embodiment of FIG. 8. When the induction coil set 802 is closer to the item under test 800, the sensor device can more sensitively detect the item under test 800 since a detectable distance is increased.

Figure 9B:
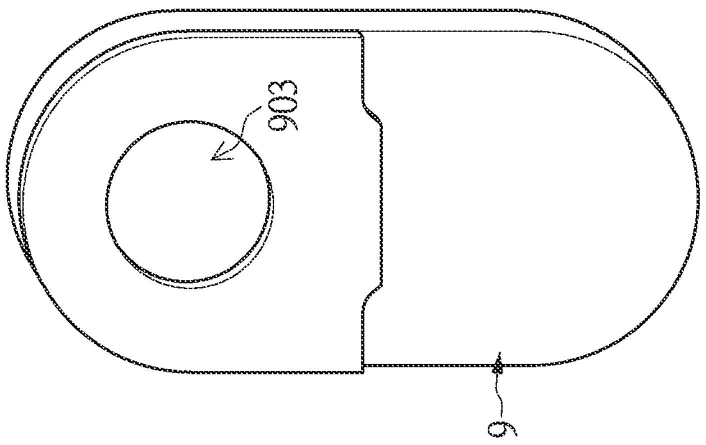
FIG. 9A and FIG. 9B are schematic diagrams illustrating the structure of the sensor device according to yet another embodiment of the present disclosure.
Figure 9A:
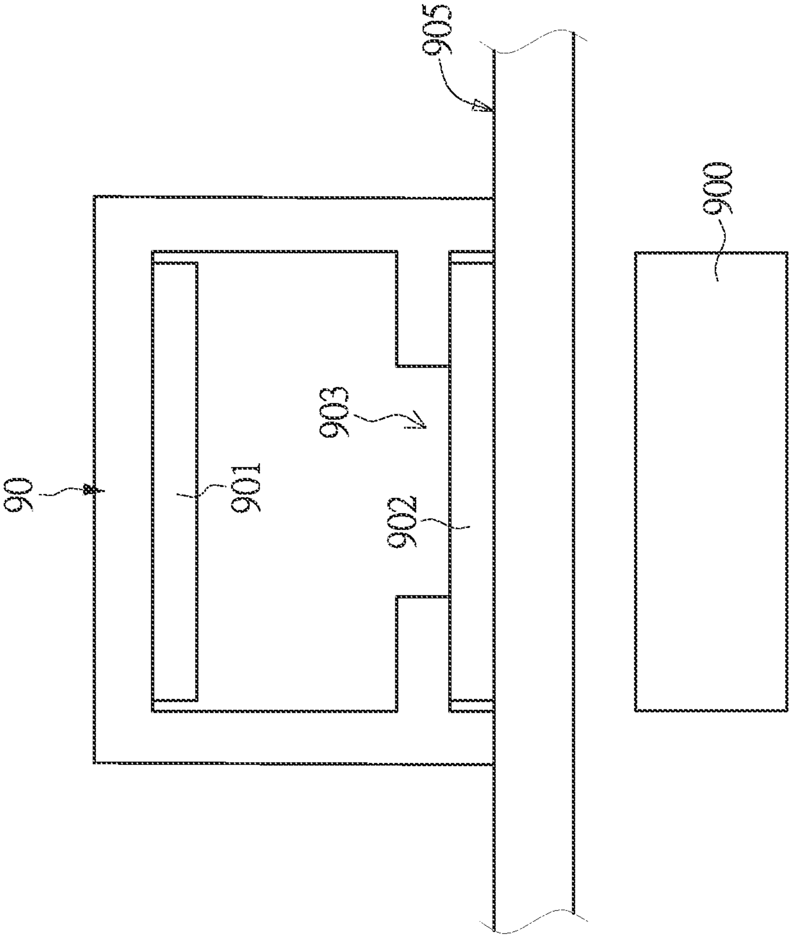

Reference is made to FIG. 9A, which is a schematic diagram illustrating the structure of the sensor device according to yet another embodiment of the present disclosure. An opening 903 is formed on a wall structure of a casing 90 that has a second induction coil set (e.g., an induction coil set 902) disposed thereon, such that the second induction coil set (e.g., the induction coil set 902) and a first induction coil set (e.g., a reference coil set 901) are not obstructed by the wall structure. Similarly, the second induction coil set of the sensor device is configured to be closer to a surface of an adhesive surface 905 for sensing a position change of an item under test 900.

Reference is made to FIG. 9B, which is a schematic diagram of a sensor device 9 that is not structurally attached to a holster, and does not have the second induction coil set (e.g., the induction coil set 902) disposed on a back side thereof. The opening 903 is formed on the back side of the casing 90. The second induction coil set (e.g., the induction coil set 902) is configured to be disposed in a containing slot of the casing 90, so as to cover and seal the opening 903 of the casing 90. Therefore, the second induction coil set can be regarded as a part (i.e., an exterior part) of the casing 90.

Figure 10:
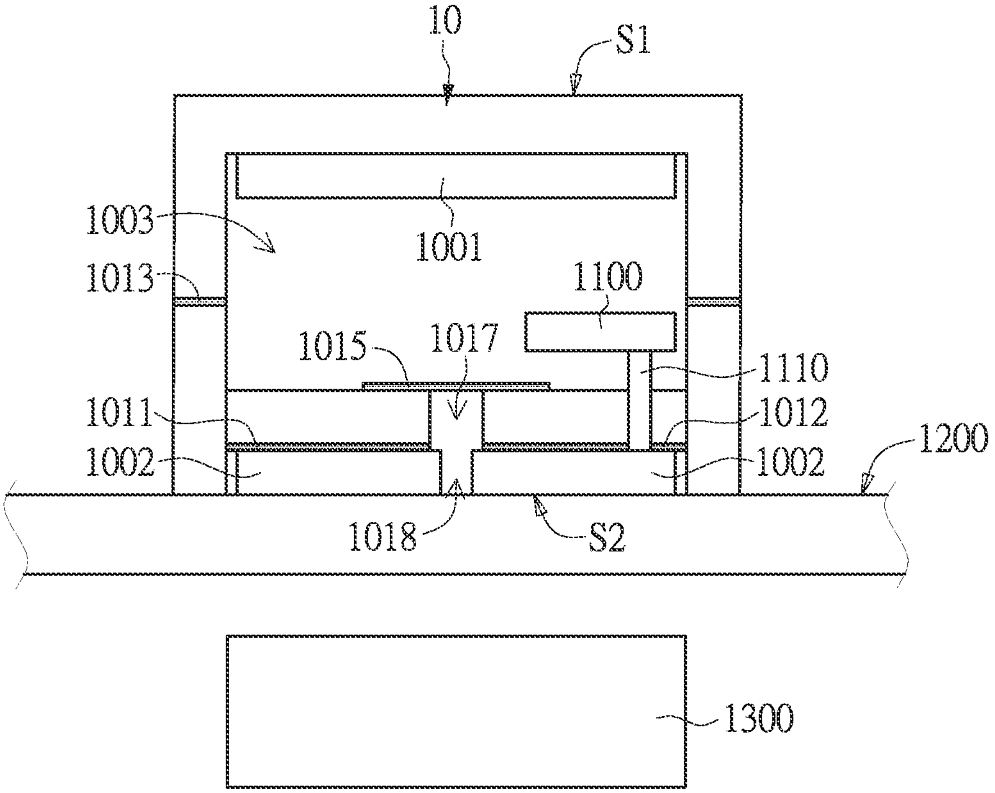
FIG. 10 is a schematic diagram illustrating the structure of the sensor device according to still another embodiment of the present disclosure.

FIG. 10 is a schematic diagram illustrating the structure of the sensor device according to still another embodiment of the present disclosure.

In FIG. 10, a first induction coil set (e.g., a reference coil set 1001) is mounted on a first side S1 of a casing 10 of the sensor device. A second induction coil set (e.g., an induction coil set 1002) of the sensor device is mounted on a second side S2 of the casing 10. In the present embodiment, the second side S2 is an outer surface of the casing 10. In particular, the second side S2 of the casing 10 is configured to have a positioning hole 1017 that serves as an airtight evacuation hole for a cavity 1003 of the casing 10. In the present embodiment, the airtight evacuation hole is sealed by a waterproof breathable membrane 1015, and an opening 1018 opposite to the positioning hole 1017 is provided for the induction coil set 1002.

In order to provide the waterproof function, waterproof glues 1011, 1012, and 1013 are disposed at many places inside the casing 10 of the sensor device. In one embodiment, a main board 1100 of the sensor device can be disposed in the cavity 1003 of the casing 10. The main board 1100 is electrically connected with the reference coil set 1001 and the induction coil set 1002 via a conductive connection structure 1110. The induction coil set 1002 is structurally adjacent to an adhesive surface 1200, such that the sensor device is able to detect a position change of an item under test 1300 more effectively.

In conclusion, in the sensor device provided by the present disclosure, the sensor device includes a reference coil set and an induction coil set that are arranged on two opposite sides of a casing within a limited space. In this way, the greater the distance between the reference coil set and the induction coil set, the greater the detectable distance between an item under test and the sensor device can be. Further, when the distance between the sensor device and the item under test becomes shorter, detection of the item under test can be even more sensitive. When the item under test moves, the sensor device can determine a position change of the item under test on the opposite side of the object according to a physical quantity difference between the reference coil set and the induction coil set.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor device, which is configured to be disposed on a surface of a side of an object, comprising:

a casing having a first side that is distant from the object and a second side that is closer than the first side to the object;

a first induction coil set disposed on the first side;

a second induction coil set disposed on the second side; and a control circuit board having a connection line that is electrically connected with the first induction coil set and the second induction coil set, and a microcontroller, wherein the microcontroller determines a position change of a metal item disposed on another side of the object according to a physical quantity difference between the first induction coil set and the second induction coil set, wherein the second induction coil set is disposed between the object and an exterior wall of the casing facing the object, wherein the first induction coil set comprises two coils mounted on two sides of a first substrate, and the second induction coil set comprises another two coils mounted on two sides of a second substrate, and wherein a cavity is defined between one of the two coils of the first induction coil set facing the second induction coil set and one of the two coils of the second induction coil set facing the first induction coil set.

2. The sensor device according to claim 1, wherein the object is a holster for accommodating a gun, the gun has the metal item, the sensor device is disposed on the holster, and the sensor device corresponds in position to the metal item when the gun is put inside the holster.

3. The sensor device according to claim 1, wherein the first induction coil set is a reference coil set that forms a reference level, and the second induction coil set is an induction coil set that forms an inductive inductance.

4. The sensor device according to claim 1, wherein a containing slot is formed on the second side of the casing, and the second induction coil set is disposed in the containing slot.

5. The sensor device according to claim 1, wherein an opening is formed on a wall structure of the casing that has the second induction coil set disposed thereon, such that the second induction coil set and the first induction coil set are unobstructed by the wall structure.

6. The sensor device according to claim 1, wherein the casing has a positioning hole that is configured as an airtight evacuation hole for a cavity formed by the casing.

7. The sensor device according to claim 6, wherein the airtight evacuation hole is sealed by a waterproof breathable membrane.

8. The sensor device according to claim 6, wherein the second induction coil set has an opening that corresponds to the positioning hole.

9. The sensor device according to claim 1, wherein the control circuit board further comprises a communication unit electrically connected with the microcontroller, and the communication unit is used to transmit an activation signal that is generated by the microcontroller according to the physical quantity difference.

10. The sensor device according to claim 1, wherein the control circuit board further comprises a power unit that is electrically connected with the microcontroller and is controlled by the microcontroller, and the power unit provides current signals to the first induction coil set and the second induction coil set for generating an induced magnetic field.

11. The sensor device according to claim 10, wherein the first induction coil set is a reference coil set that forms a reference level, and the second induction coil set is an induction coil set that forms an inductive inductance.

12. The sensor device according to claim 1, wherein the sensor device implements a proximity sensor or a differential inductive switch, the first induction coil set and the second induction coil set respectively form two different effective sensing ranges, so as to form a reference inductance and an inductive inductance, and when a position of the metal item changes, an inductance difference between the reference inductance and the inductive inductance also changes.

13. The sensor device according to claim 12, wherein the first induction coil set is a reference coil set that forms a reference level, and the second induction coil set is an induction coil set that forms the inductive inductance.

14. The sensor device according to claim 1, wherein the casing defines a containing slot disposed between a first sidewall of the casing, a second sidewall of the casing, and the exterior wall extending between the first sidewall and the second sidewall.

15. The sensor device according to claim 1, wherein a total inductive area of the first induction coil set is smaller than a total inductive area of the second induction coil set.

16. The sensor device according to claim 1, wherein the second induction coil set is disposed between the object and the exterior wall of the casing facing the object such that the second induction coil set is disposed on an exterior of the casing.

17. The sensor device according to claim 1, wherein the second induction coil set is disposed between the object and the exterior wall of the casing facing the object such that the second induction coil set is co-planar with a surface of the exterior wall closest to the object.

* * * * *